(12) United States Patent
Xi et al.

(10) Patent No.: US 11,444,107 B2
(45) Date of Patent: Sep. 13, 2022

(54) MANUFACTURING METHOD OF DISPLAY PANEL

(71) Applicant: Au Optronics Corporation, Hsinchu (TW)

(72) Inventors: Peng-Bo Xi, Taipei (TW); Chun-Cheng Cheng, Hsinchu (TW)

(73) Assignee: AU Optronics Corporation, Hsinchu (TW)

( * ) Notice: Subject to any disclaimer, the term of this patent is extended or adjusted under 35 U.S.C. 154(b) by 177 days.

(21) Appl. No.: 17/037,666

(22) Filed: Sep. 30, 2020

(65) Prior Publication Data

US 2021/0013247 A1  Jan. 14, 2021

Related U.S. Application Data

(62) Division of application No. 16/384,853, filed on Apr. 15, 2019, now Pat. No. 10,892,285.

(60) Provisional application No. 62/659,662, filed on Apr. 18, 2018.

(30) Foreign Application Priority Data

Mar. 26, 2019  (TW) .................................. 108110425

(51) Int. Cl.
*H01L 27/12* (2006.01)
*H01L 25/16* (2006.01)
*H01L 23/544* (2006.01)

(52) U.S. Cl.
CPC ........ *H01L 27/1288* (2013.01); *H01L 23/544* (2013.01); *H01L 25/167* (2013.01); *H01L 27/124* (2013.01); *H01L 2223/54426* (2013.01)

(58) Field of Classification Search
CPC . H01L 27/1288; H01L 23/544; H01L 25/167; H01L 27/124; H01L 27/1218; H01L 2223/54426; H01L 27/156; H01L 27/3244; H01L 2227/323
See application file for complete search history.

(56) References Cited

U.S. PATENT DOCUMENTS

2007/0238032 A1 * 10/2007 Murano .................... G03F 1/32
  430/394
2018/0107312 A1 * 4/2018 Wang .................... G06F 3/0412

* cited by examiner

*Primary Examiner* — Yasser A Abdelaziez
(74) *Attorney, Agent, or Firm* — JCIPRNET

(57) ABSTRACT

A manufacturing method of a display panel includes providing a substrate having a first surface and a second surface opposite to the first surface; forming a high-shielding position layer on the first surface, wherein the light-shielding positioning layer has at least one first alignment pattern; forming a transparent material layer on the second surface; forming a photoresist layer on the transparent material layer; performing an exposure process, such that a light beam passes through the at least one first alignment pattern to penetrate through the substrate and the transparent material layer to the photoresist layer; performing a developing process to pattern the photoresist layer and form a patterned photoresist layer; and performing an etching process to pattern the transparent positioning layer having at least one second alignment pattern. In a direction perpendicular to the substrate, at least one first alignment pattern overlaps with at least one second alignment pattern.

12 Claims, 12 Drawing Sheets

MANUFACTURING METHOD OF DISPLAY PANEL

CROSS-REFERENCE TO RELATED APPLICATION

This application is a divisional application of and claims the priority benefit of U.S. application Ser. No. 16/384,853, filed on Apr. 15, 2019, now pending, which claims the priority benefit of U.S. provisional application Ser. No. 62/659,662, filed on Apr. 18, 2018, and Taiwan application serial no. 108110425, filed on Mar. 26, 2019. The entirety of each of the above-mentioned patent applications is hereby incorporated by reference herein and made a part of this specification.

BACKGROUND

Technical Field

The invention relates to a display panel and more particularly, to a display panel including alignment patterns formed by means of sell-alignment and a manufacturing method thereof.

Description of Related Art

Along with development in technologies, sizes of display panels have also been increasing year by year. However, it is impossible for a mother substrate used for manufacturing the display panels to be infinitely enlarged. Currently, to manufacture a large-size display device, a plurality of display panels are spliced together to form a large-size display device. However, when the plurality of display panels are spliced, a plurality of issues still exist regarding how to splice the plurality of display panels accurately and whether or not the spliced display device includes a narrow frame or is seamless.

SUMMARY

The invention provides a display panel suitable for being narrow-framed or frameless and a manufacturing method thereof capable of improving alignment accuracy and reliability of the display panel.

A manufacturing method of a display panel of the invention includes the following steps. A substrate having a first surface and a second surface opposite to the first surface is provided. A light-shielding positioning layer is formed on the first surface, wherein the light-shielding positioning layer has at least one first alignment pattern. A transparent material layer is formed on the second surface. A photoresist layer is formed on the transparent material layer. An exposure process is performed, such that a light beam passes through the at least one first alignment pattern to penetrate through the substrate and the transparent material layer to the photoresist layer. A developing process is performed to pattern the photoresist layer and forms a patterned photoresist layer. An etching process is performed to pattern the transparent material layer using the patterned photoresist layer as a mask to form a transparent positioning layer having at least one second alignment pattern, wherein in a direction perpendicular to the substrate, the at least one first alignment pattern overlaps with the at least one second alignment pattern.

A display panel of the invention includes a substrate, a light-shielding positioning layer and a transparent positioning layer. The substrate has a first surface and a second surface opposite to the first surface. The light-shielding positioning layer is disposed on the first surface and has at least one first alignment pattern. The transparent positioning layer is disposed on the second surface and has at least one second alignment pattern. In a direction perpendicular to the substrate, at least one first alignment pattern overlaps with at least one second alignment pattern.

Based on the above, in the manufacturing method of the display panel of one of the embodiments of the invention, the second alignment patterns of the transparent positioning layer are formed by the following steps. The substrate having the first surface and the second surface opposite to the first surface is provided. The exposure process and the developing process are performed using the first alignment patterns of the light-shielding positioning layers located on the first surface to form the patterned photoresist layer located on the second surface. And, the etching process is performed on the transparent material layer located on the second surface using the patterned photoresist layer as the mask. Thereby, the second alignment patterns can be formed by means of self-alignment and overlap with the first alignment patterns in the direction perpendicular to the substrate.

On the other hand, since the second alignment patterns can be formed by means of self-alignment via the first alignment patterns, alignment accuracy between the first pads formed by performing the alignment process using the first alignment patterns and the second pads formed by performing the alignment process using the second alignment patterns can be improved. In this way, in the display panel of the invention, through disposing the light-shielding positioning layer having the first alignment patterns on the first surface and disposing the transparent positioning layer having the second alignment patterns on the second surface, the first alignment patterns can overlap with the second alignment patterns in the direction perpendicular to the substrate, such that a probability that the connection structure fails to achieve the connection capability due to misalignment of the first pads disposed on the first surface and the second pads disposed on the second surface can be reduced, and the reliability can be enhanced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
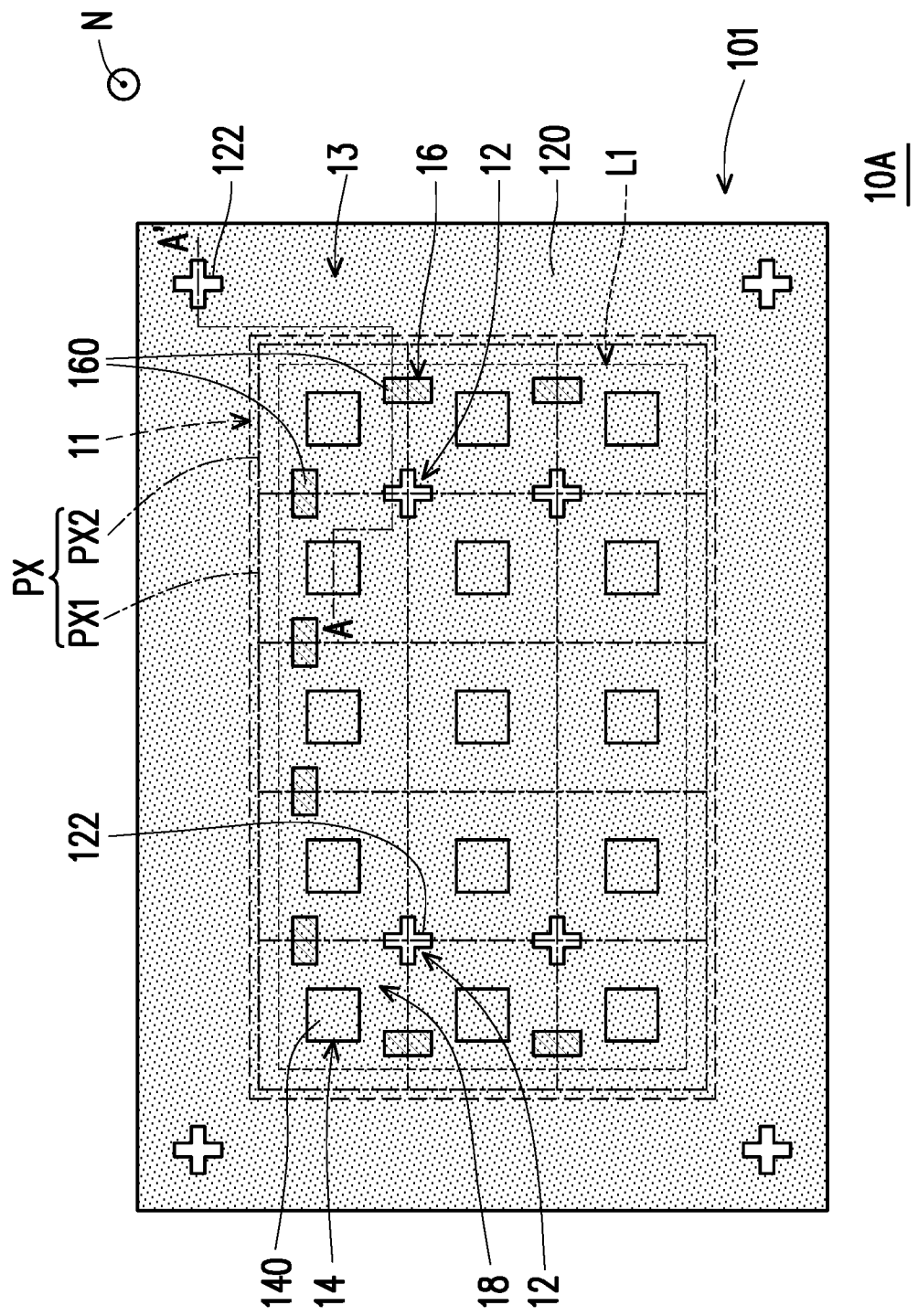
FIG. 1A is a schematic top view showing a first surface of a display panel before being cut according to an embodiment of the invention.

In order to make the aforementioned and other features and advantages of the invention more comprehensible, several embodiments accompanied with figures are described in detail below. As persons with ordinary skills in the art can be aware of, the embodiments as described can be modified in various methods, without departing from the spirit or scoped of the invention.

In the accompanying drawings, for clarity, the thickness of each element is exaggerated. Throughout the specification, the same reference numerals in the accompanying drawings denote the same elements. It should be understood that when an element such as a layer, film, region or substrate is referred to as being "on", "connected to" or "overlapping with" another element, it may be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected.

It should be understood that, although the terms "first", "second", "third", etc., may be used herein to describe various elements, components, regions, layers and/or sections, these elements, components, regions, layers, and/or sections should not be limited by these terms. These terms are used to distinguish one element, component, region, layer or section from another element, component, region, layer or section. Thus, a "first element", "component", "region", "layer" or "part" discussed below may be referred to as a second element, component, region, layer or part, without departing from the teaching of the specification.

Moreover, relative terms such as "below" or "bottom" and "above" or "top" may serve to describe the relation between one component and another component in the text according to the illustration of the drawings. It should also be understood that the relative terms are intended to include different orientations of a device in addition to the orientation shown in the drawings. For example, if a device in the drawings is flipped, a component described as being disposed "below" other components should be re-orientated to be "above" other components. Thus, the exemplary term "below" may cover the orientations of "below" and "above", depending on a specific orientation of the drawings. Similarly, if a device in a figure is flipped over, the element originally described to be located "below" or "underneath" other element is oriented to be located "on" the other element. Therefore, the illustrative term "under" or "below" may include orientations of "above" and "under".

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

Figure 1B:
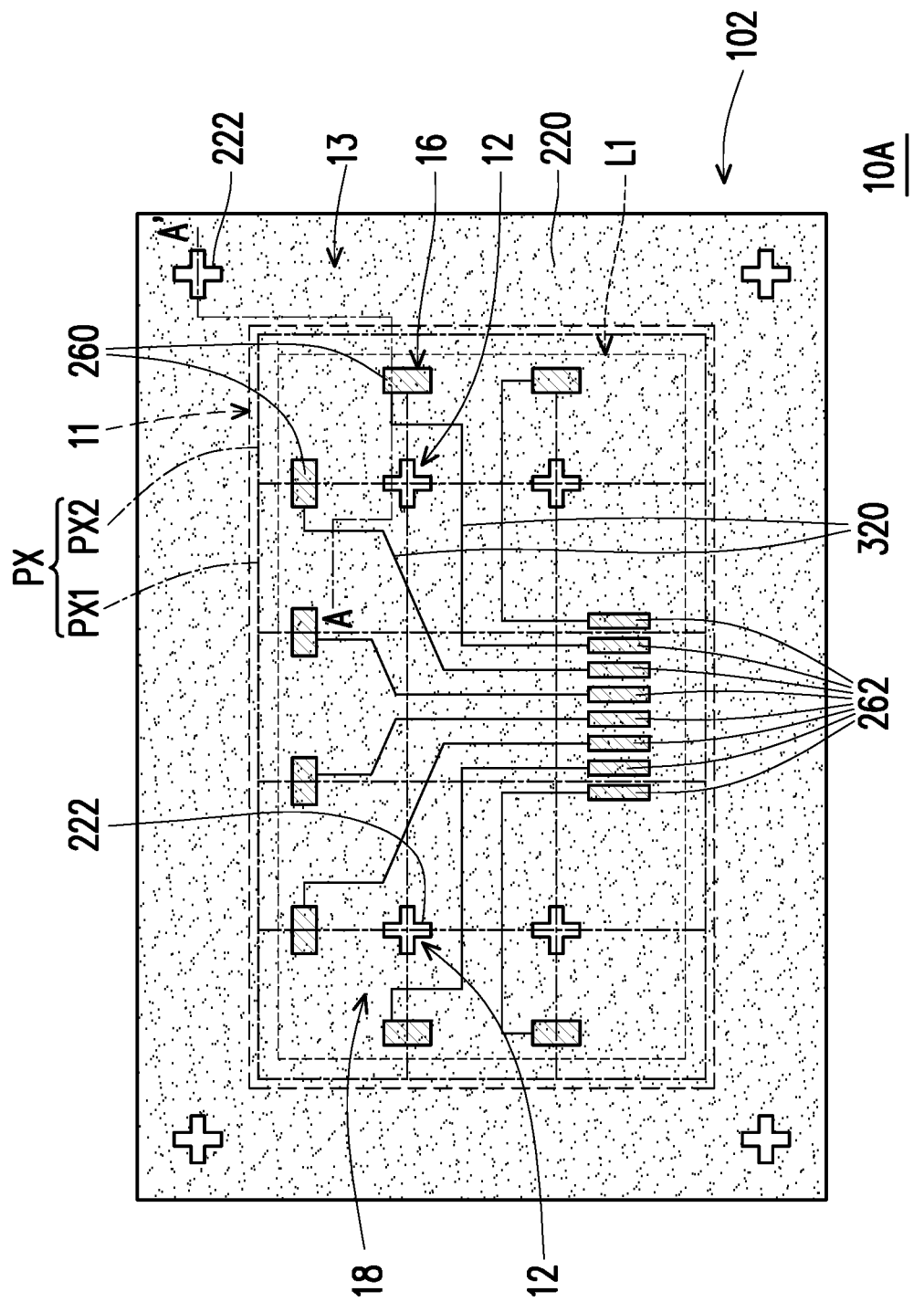
FIG. 1B is a schematic top view showing a second surface of the display panel before being cut according to an embodiment of the invention.

FIG. 1A is a schematic top view showing a first surface of a display panel before being cut according to an embodiment of the invention. In FIG. 1A, for descriptive convenience and observation, only portions of the components are schematically illustrated. FIG. 1B is a schematic top view showing a second surface of the display panel before being cut according to an embodiment of the invention. In FIG. 1B, for descriptive convenience and observation, only portions of the components are schematically illustrated. FIG. 2A through FIG. 2G are schematic cross-sectional views along a cross-sectional line A-A' in FIG. 1A and FIG. 1B showing a manufacturing process of the display panel. FIG. 3 is a schematic cross-sectional views showing a display panel according to an embodiment of the invention. It should be noted that the cross-sectional position in FIG. 3 may correspond to the position of the cross-sectional line A-A' in FIG. 1A and FIG. 1B.

Referring to FIG. 1A, FIG. 1B and FIG. 3 first, in the present embodiment, a display panel 10B and/or a display panel 10A before being cut include a substrate 100, a light-shielding positioning layer 120 and a transparent positioning layer 220, wherein the substrate 100 has a first surface 101 and a second surface 102 opposite to the first surface 101, the light-shielding positioning layer 120 is disposed on the first surface 101, and the transparent positioning layer 220 is disposed on the second surface 102. The light-shielding positioning layer 120 has at least one first alignment pattern 122. The transparent positioning layer 220 has at least one second alignment pattern 222. In a direction N perpendicular to the substrate 100, the at least one first alignment pattern 122 overlaps with the at least one second alignment pattern 222. The display panel 10B further includes at least one first pad 160, at least one second pad 260 and at least one connection structure 400 electrically connected to the at least one first pad 160 and the at least one second pad 260. For clarity, FIG. 1A schematically illustrates a pattern of the light-shielding positioning layer 120 that may be observed in a direction from the first surface 101 (which is an upper surface) of the substrate 100 to the second surface 102. FIG. 1B schematically illustrates a pattern of the transparent positioning layer 220 that may be observed in a direction from the second surface 102 (which is a lower surface) of the substrate 100 to the first surface 101. An embodiment is provided below to describe a manufacturing method of the display panel 10B.

Figure 2A:
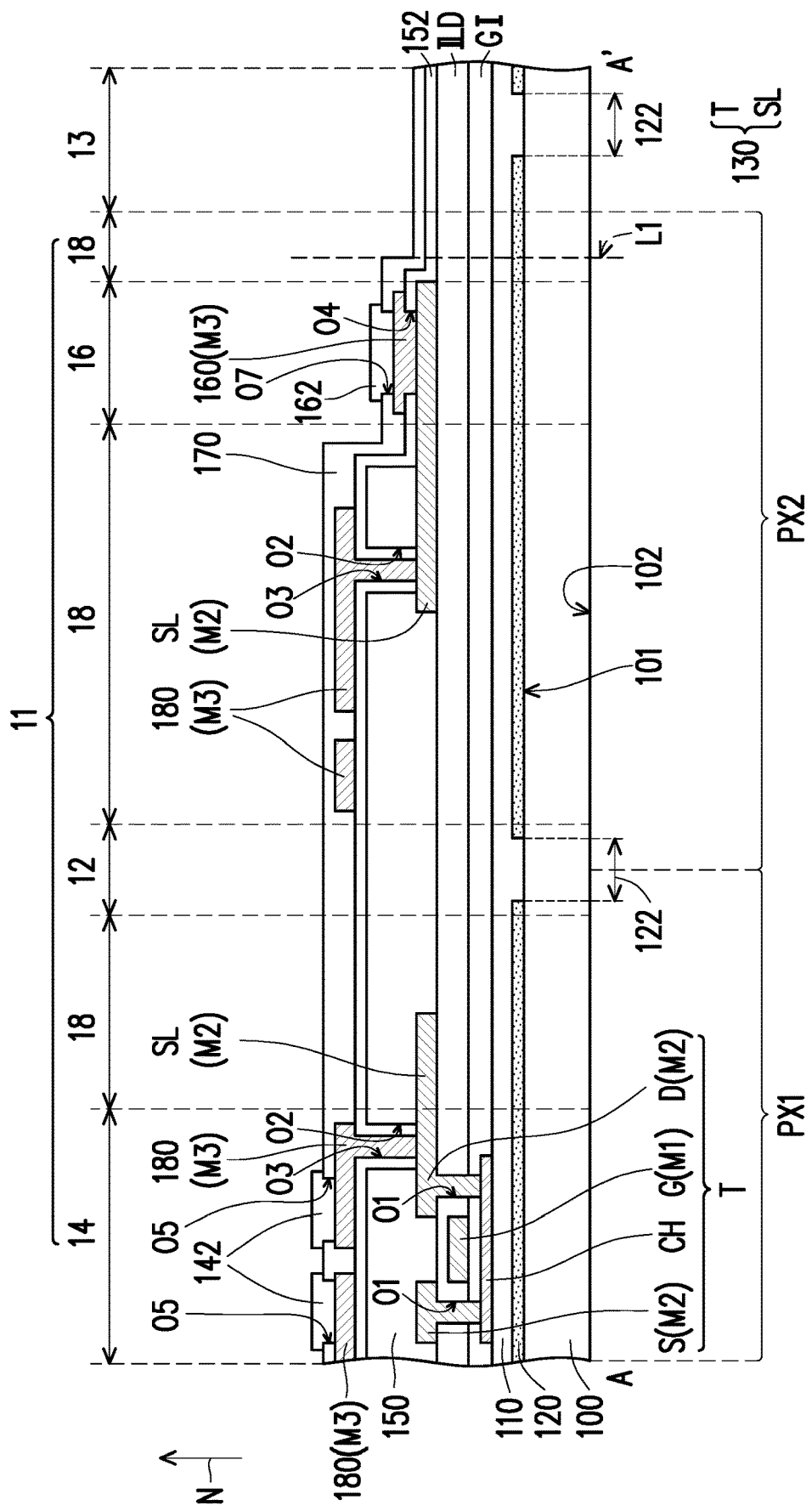
FIG. 2A through FIG. 2G are schematic cross-sectional views along a cross-sectional line A-A' in FIG. 1A and FIG. 1B showing a manufacturing process of the display panel.
Figure 3:
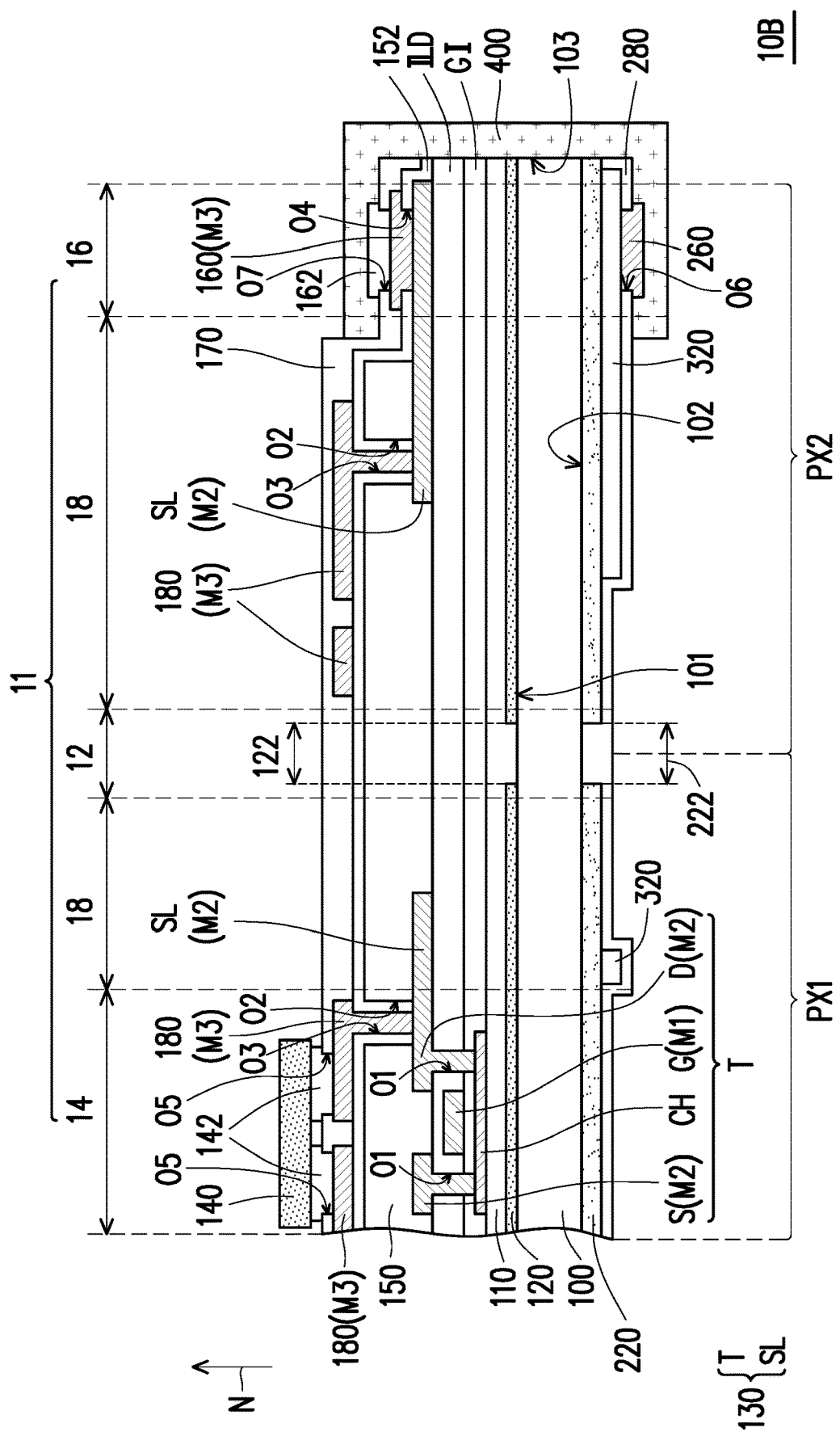
FIG. 3 is a schematic cross-sectional views showing a display panel according to an embodiment of the invention.

Referring to FIG. 1A and FIG. 2A, first, a substrate 100 is provided. In the present embodiment, a material of the substrate 100 includes glass, quartz, an organic polymer or any other applicable material, but the invention is not limited thereto.

In the present embodiment, the substrate 100 has a display region 11 and a peripheral region 13 surrounding the display region 11. The display region 11 further includes a plurality of element areas 14, a conductive line area 18 and at least one alignment pattern area 12. The display region 11 further includes at least one pad region 16. These element areas 14, the alignment pattern area 12 and the pad region 16 are separated from one another. At least a portion of the conductive line area 18 surrounds the element areas 14, the alignment pattern area 12 and the pad region 16.

Then, multiple film layers are formed on the first surface 101 of the substrate 100. As illustrated in FIG. 2A, a first insulation layer 110 is formed on the first surface 101. The first insulation layer 110 is, for example, entirely formed on the substrate 100 and located in the display region 11 and the peripheral region 13. In the present embodiment, a material of the first insulation layer 110 includes an inorganic material, an organic material or a combination of the aforementioned materials or any other applicable material. The inorganic material includes, for example (but not limited to), silicon oxide, silicon nitride, silicon oxynitride or a stack layer of at least two of the aforementioned materials. The organic material includes, for example (but not limited to), a polyimide-based resin, an epoxy resin or an acrylic resin or any other polymer material. In the present embodiment, the first insulation layer 110 is a single film layer, but the invention is not limited thereto. In other embodiments, the first insulation layer 110 may also be formed by stacking a plurality of film layers. Additionally, in the present embodiment, the first insulation layer 110 may be formed on the first surface 101 by using a physical vapor deposition method, a chemical vapor deposition method or other applicable methods.

In the present embodiment, before the step of forming the first insulation layer 110, the light-shielding positioning layer 120 may be first formed on the first surface 101. In the present embodiment, a method of forming the light-shielding positioning layer 120 may include forming a light-shielding positioning material layer (not shown) on the first surface 101, and then patterning the light-shielding positioning material layer to form the light-shielding positioning layer 120 having the at least one first alignment pattern 122. In the present embodiment, the first alignment patterns 122 are opening patterns, i.e., exist in a form of openings in the light-shielding positioning layer 120, as illustrated in FIG. 2A. Additionally, in the present embodiment, the first insulation layer 110 is filled in the first alignment patterns 122. A method of forming the first alignment patterns 122 may include a photolithography and etching process, a laser ablation process or other applicable removing methods, but the invention is not limited thereto. In the present embodiment, a portion of the light-shielding positioning layer 120 other than the first alignment patterns 122 is capable of shielding a light beam L (which will be described in detail below) used in a subsequent exposure process. In the present embodiment, the light-shielding positioning layer 120 is generally made of a metal material, but the invention is not limited thereto. According to other embodiments, the light-shielding positioning layer 120 may be made of an alloy or a metal material and/or a stack layer of an alloy or other conductive materials. The conductive materials as aforementioned include, for example, a metal nitride material, a metal oxide material, a metal oxynitride material, or any other applicable material. In another embodiment, the light-shielding positioning layer 120 may also be made of an organic material, or a stack layer of at least two of the materials of the aforementioned light-shielding positioning layer 120, but the invention is not limited thereto. As illustrated in FIG. 1A, the at least one first alignment pattern 122 including 8 first alignment pattern 122 is taken as an example, but the invention is not limited thereto, and the number of the first alignment patterns 122 may be designed as one or more based on actual requirements.

As illustrated in FIG. 1A, a user (not shown) observes in an overlooking direction, the first alignment patterns 122 may be presented approximately in a criss-cross shape and may allow the light beam L (illustrated in FIG. 2C) to pass through in the subsequent exposure process. However, the invention is not limited thereto, and in other embodiments that are not shown, the first alignment patterns 122 may be presented in a star shape, a circular shape or any other recognizable patterned shape. Additionally, in the overlooking direction, the first alignment patterns 122 may be disposed corresponding to the alignment pattern area 12 or the peripheral region 13. In other words, in some embodiments, the first alignment patterns 122 may be merely correspondingly located in the alignment pattern area 12 of the display region 11 or merely correspondingly located in the peripheral region 13. In some other embodiments, the first alignment patterns 122 may be disposed corresponding to the alignment pattern area 12 and the peripheral region 13 at the same time. Hereinafter, the description related to the first alignment patterns 122 which are disposed corresponding to the alignment pattern area 12 and the peripheral region 13 at the same time will be set forth below.

Then, multiple pixel units PX are formed in the display region 11. In the present embodiment, in the direction N perpendicular to the substrate 100, each of the pixel units PX overlaps with one of the element areas 14. Additionally, in the present embodiment, the pixel units PX are arranged in an array in the display region 11, but the invention is not limited thereto. Additionally, as illustrated in FIG. 1A, the pixel units PX include 15 pixel units PX, for example, however, any person of ordinary skill in the art should be able to understand that the number of the pixel units PX may be set based on a user demand, without being limited to the number as illustrated in FIG. 1A.

In the present embodiment, as illustrated in FIG. 1A and FIG. 2A, the pixel units PX may include a first pixel unit PX1 and a second pixel unit PX2 arranged abreast in the display region 11. In other words, the cross-sectional view depicted in FIG. 2A merely partially illustrates partial structures of two pixel units (i.e., the first pixel unit PX1 and the second pixel unit PX2) among the plurality of pixel units PX. Even so, according to the description related to the first pixel unit PX1 and the second pixel unit PX2 that will be set forth below, any person of ordinary skill in the art should be able to understand the structures and arrangement manners of the rest of the pixel units.

In the present embodiment, a step of forming each of the pixel units PX may include forming an element layer 130 on the first insulation layer 110, forming a second insulation layer 150 on the element layer 130 and forming a plurality of conductive lines 180 above the second insulation layer 150. Additionally, in the present embodiment, the step of forming each of the pixel units PX may further selectively include forming the second insulation layer 150 on the third insulation layer 152. Additionally, in the present embodiment, during the process of forming the plurality of conductive lines 180 above the second insulation layer 150, the at least one first pad 160 may be formed on the second insulation layer 150.

In the present embodiment, the element layer 130 may include an active element T and a signal line SL. Referring to FIG. 1A and FIG. 2A, the active element T in the first pixel unit PX1 is disposed corresponding to the element area 14. It should be noted that even though the cross-sectional view depicted in FIG. 2A along the cross-section line A-A' merely illustrates that the first pixel unit PX1 includes the active element T, any person of ordinary skill in the art should be able to understand that each of the pixel units PX includes the active element T disposed corresponding to the element area 14 to drive the light-emitting element 140 (illustrated in FIG. 2G) in the pixel unit PX. On the other hand, even though FIG. 2A illustrates that only one active element T is disposed corresponding to the element area 14, but the invention is not limited thereto, and any person of ordinary skill in the art should be able to understand that the element layer 130 may include two, three or more active elements T to drive the light-emitting element 140 (illustrated in FIG. 2G) in the pixel unit PX.

Referring to FIG. 1A and FIG. 2A, in the first pixel unit PX1, the signal line SL is electrically connected to the active element T and the conductive line 180, and in the second pixel unit PX2, the signal line SL is electrically connected to the conductive line 180 and the first pad 160. In other words, in the present embodiment, the signal line SL in the element layer 130 is used to be electrically connected to other components for signal transmission. According to another point of view, referring to FIG. 1A and FIG. 2A, in the first pixel unit PX1, the signal line SL, which electrically connects to the active element T located in the element areas 14, extends into the conductive line area 18, and in the second pixel unit PX2, the signal line SL may extend from the conductive line area 18 into the pad region 16. It should be noted that even though the cross-sectional view depicted in FIG. 2A along the cross-section line A-A' merely illustrates a signal line SL in the first pixel unit PX1 and a signal line SL in the second pixel unit PX2, any person of ordinary skill in the art should be able to understand that the element layer 130 may include two, three or more signal lines SL. In the present embodiment, the signal line SL is, for example, a scan line, a data line, a common signal line, a power line or any other adaptive line, which is not limited in the invention.

In the present embodiment, the element layer 130 may include one or more conductive layers, one or more dielectric layers or one or more semiconductor layers formed by a general semiconductor manufacturing process. As illustrated in FIG. 2A, the active element T may include a gate G, a semiconductor layer CH, a source S and a drain D. In the present embodiment, the gate G is, for example, formed by a first conductor layer M1, located above the semiconductor layer CH and separated from the semiconductor layer CH by a gate insulation layer GI. In other words, the active element T is illustrated as a top gate thin film transistor (TFT) as an example, but the invention is not limited thereto. According to other embodiments, the active element T may also be a bottom gate TFT (i.e., the gate G is located beneath the semiconductor layer CH and is separated from the semiconductor layer CH by the gate insulation layer GI), or other applicable types of TFTs. In the present embodiment, the semiconductor layer CH may be a single-layer or a multi-layer structure and may be made of polysilicon, amorphous silicon, monocrystalline silicon, microcrystalline silicon, an oxide semiconductor material, an organic semiconductor material, perovskite, carbon nano-tubes, or any other applicable material, or a combination of at least one of the aforementioned materials.

In the present embodiment, the source S and the drain D are located above the semiconductor layer CH. In the present embodiment, the source S and the drain D are electrically connected to the semiconductor layer CH respectively through contact windows O1 formed in the gate insulation layer GI and an interlayered insulation layer ILD. As illustrated in FIG. 2A, in the first pixel unit PX1, the signal line SL is electrically connected to the drain D of the active element T. In the present embodiment, the source S, the drain D and the signal line SL may belong to the same film layer and may be formed by a second conductor layer M2. The first conductor layer M1 and the second conductor layer M2 are generally made of metal materials, but the invention is not limited thereto. According to other embodiments, the first conductor layer M1 and the second conductor layer M2 may be made of other conductive materials, for example, an alloy, a metal nitride material, a metal oxide material, a metal oxynitride material, or a stack layer of a metal material and other conductive materials. In the present embodiment, the material of the first conductor layer M1 is substantially the same as or different from the material of the second conductor layer M2.

In the present embodiment, the second insulation layer 150 is formed on the substrate 100 for protecting or planarizing the element layer 130 in each of the pixel units PX. According to another aspect, in the present embodiment, the element layer 130 in each of the pixel units PX is located between the first insulation layer 110 and the second insulation layer 150. In the present embodiment, a material of the second insulation layer 150 includes an inorganic material, an organic material or a combination of the materials or any other applicable material. The inorganic material includes, for example (but not limited to), silicon oxide, silicon nitride, silicon oxynitride or a stack layer of at least two of the materials. The organic material includes, for example (but not limited to), a polyimide-based resin, an epoxy resin or an acrylic resin or any other polymer material. In the present embodiment, the material of the second insulation layer 150 may be substantially as the same or different from the material of the first insulation layer 110. In the present embodiment, the second insulation layer 150 is a single film layer, but the invention is not limited thereto. In other embodiments, the second insulation layer 150 may be formed by stacking a plurality of film layers.

In the present embodiment, the third insulation layer 152 is formed on the substrate 100 to cover each of the pixel units PX. As illustrated in FIG. 2A, the third insulation layer 152 may be filled in a plurality of openings O2 in the second insulation layer 150, wherein a part of the signal line SL is exposed by the openings O2. In the present embodiment, a material of the third insulation layer 152 includes an inorganic material, an organic material or a combination of the materials or any other applicable material. The inorganic material includes, for example (but not limited to), silicon oxide, silicon nitride, silicon oxynitride or a stack layer of at least two of the materials. The organic material includes, for example (but not limited to), a polyimide-based resin, an epoxy resin or an acrylic resin or any other polymer material. In the present embodiment, the material of the third insulation layer 152 may be the same as or different from the material of the first insulation layer 110. In the present embodiment, the third insulation layer 152 is a single film layer, but the invention is not limited thereto. In other embodiments, the third insulation layer 152 may be formed by stacking a plurality of film layers.

As illustrated in FIG. 2A, the conductive line 180 is disposed on the third insulation layer 152. In the present embodiment, a part of the conductive line 180 is electrically connected to the element layer 130. As illustrated in FIG. 2A, in the first pixel unit PX1, a conductive line 180 located in the element area 14 may be electrically connected to the active element T through a contact window O3 in the third insulation layer 152, and in the second pixel unit PX2, a conductive line 180 located in the conductive line area 18 may be electrically connected to the signal line SL through the contact window O3 in the third insulation layer 152, but the invention is not limited thereto. In the present embodiment, the conductive line 180 is formed by a third conductor layer M3. The third conductor layer M3 is generally made of a metal material, but the invention is not limited thereto. According to other embodiments, the third conductor layer M3 may be made of any other conductive material, for example, an alloy, a metal nitride material, a metal oxide material, a metal oxynitride material, or a stack layer of a metal materials and other conductive materials. In the present embodiment, the material of the third conductor layers M3 may be the same as or different from the material of the first conductor layer M1. In the present embodiment, in the direction N perpendicular to the substrate 100, the signal lines SL and the conductive lines 180 in the first pixel unit PX1 and the second pixel unit PX2 do not overlap with the first alignment pattern 122 in the alignment pattern area 12. In this way, in the exposure process that is subsequently performed, the light-shielding positioning layer 120 may be applied as a mask, and the light beam L (illustrated in FIG. 2C) passing through the first alignment pattern 122 is not shielded or affected by the signal lines SL and the conductive lines 180 located on the first surface 101.

As illustrated in FIG. 1A, in the direction N perpendicular to the substrate 100, the first pixel unit PX1 and the second pixel unit PX2 simultaneously overlap with a first alignment pattern 122 (i.e., an alignment pattern area 12) disposed in the display region 11. Furthermore, as illustrated in FIG. 1A, in the direction N perpendicular to the substrate 100, each first alignment pattern 122 disposed in the display region 11 simultaneously overlaps with 4 pixel units PX, but the invention is not limited thereto. In some embodiments, each first alignment pattern 122 disposed in the display region 11 may simultaneously overlap with one, two or three pixel units PX. On the other hand, as illustrated in FIG. 1A, there are 12 pixel units PX overlapping with the first alignment patterns 122 on the substrate 100, but the invention is not limited thereto, and it falls within the scope of the invention as long as a part of the pixel units PX overlap with the first alignment patterns 122 on the substrate 100.

In the present embodiment, the first alignment patterns 122 in the peripheral region 13 may be disposed corresponding to corners of the peripheral region 13. As illustrated in FIG. 1A, the first alignment patterns 122 in the peripheral region 13 may be disposed simultaneously disposed at four corners of the peripheral region 13, but the invention is not limited thereto. In other embodiments that are not shown, the first alignment patterns 122 may be disposed at one, two, three or four corners of the peripheral region 13. In other words, it falls within the scope of the invention as long as the first alignment patterns 122 are disposed on the substrate 100.

As illustrated in FIG. 1A, the at least one first pad 160 including 8 first pads 160 is taken as an example, but the invention is not limited thereto, and the number of the first pads 160 may be designed as one or more based on actual requirements. In the present embodiment, as illustrated in FIG. 2A, the first pads 160 and the conductive lines 180 may belong to the same film layer. In other words, the first pads 160 are also formed by the third conductor layers M3. Referring to FIG. 1A and FIG. 2A, the first pads 160 are disposed in the pad regions 16 and located on the element layer 130. In detail, as illustrated in FIG. 2A, the first pad 160 is electrically connected to the signal line SL through a contact window O4 in the third insulation layer 152.

In the present embodiment, the first pads 160 are formed in the pad regions 16 by performing an alignment process using the first alignment patterns 122 in the light-shielding positioning layer 120. In other words, in the present embodiment, the first alignment patterns 122 may be used as a base for forming the first pads 160, such that the first pads 160 may be accurately formed in the pad regions 16. Based on the consideration of conductivity, the first pads 160 are generally made of a metal material, but the invention is not limited thereto.

Additionally, as illustrated in FIG. 1A, in the direction N perpendicular to the substrate 100, the first pixel unit PX1 and the second pixel unit PX2 simultaneously overlap with a first pad 160 (i.e., a pad region 16) disposed in the display region 11. Furthermore, as illustrated in FIG. 1A, in the direction N perpendicular to the substrate 100, each pad region 16 disposed in the display region 11 simultaneously overlaps with two pixel units PX, but the invention is not limited thereto. In some embodiments, each pad region 16 disposed in the display region 11 may only overlap with one pixel unit PX. On the other hand, as illustrated in FIG. 1A, there are 9 pixel units PX overlapping with the pad regions 16 on the substrate 100, but the invention is not limited thereto, and it falls within the scope of the invention as long as a part of the pixel units PX overlap with the pad regions 16 on the substrate 100. Additionally, as illustrated in FIG. 1A, the pad regions 16 are disposed corresponding to three sides of the display region 11, but the invention is not limited thereto. In some embodiments, the pad regions 16 may also be collectively disposed corresponding to one side of the display region 11. In some other embodiments, the pad regions 16 may also be disposed corresponding to two sides of the display region 11. In yet some other embodiments, the pad regions 16 may also be disposed corresponding to all sides of the display region 11.

In the present embodiment, after the pixel units PX are formed, a protection layer 170 is formed on the conductive line 180 and the first pad 160 of each of the pixel units PX. As illustrated in FIG. 2A, in the first pixel unit PX1, the protection layer 170 has contact windows O5 exposing the conductive line 180 located in the element area 14. Since the cross-sectional view depicted in FIG. 2A merely partially illustrates partial structures of the first pixel unit PX1 and the second pixel unit PX2, according to the descriptions related to the first pixel unit PX1 and the second pixel unit PX2, any person of ordinary skill in the art should be able to understand that the protection layer 170 may have the contact window O5 corresponding to each of the pixel units PX. Additionally, as illustrated in FIG. 2A, in the second pixel unit PX2, the protection layer 170 has a contact window O7 exposing the first pad 160. Since the cross-sectional view depicted in FIG. 2A merely partially illustrates partial structures of the first pixel unit PX1 and the second pixel unit PX2, according to the descriptions related to the first pixel unit PX1 and the second pixel unit PX2, any person of ordinary skill in the art should be able to understand that the protection layer 170 may have a contact window O7 corresponding to each first pad 160. In the present embodiment, the protection layer 170 is correspondingly disposed in the display region 11 and the peripheral region 13. In the present embodiment, a material of the protection layer 170 includes an inorganic material, an organic material or a combination of the materials or any other applicable material. The inorganic material includes, for example (but not limited to), silicon oxide, silicon nitride, silicon oxynitride or a stack layer of at least two of the materials. The organic material includes, for example (but not limited to), a polyimide-based resin, an epoxy resin or an acrylic resin or any other polymer material.

In the present embodiment, a plurality of electrodes 142 are formed on the protection layer 170. As illustrated in FIG. 2A, the electrodes 142 are respectively electrically connected to the conductive lines 180 through the contact windows O5 in the protection layer 170, wherein one of the conductive lines 180 is electrically connected to the element layer 130. Since the cross-sectional view depicted in FIG. 2A merely partially illustrates partial structures of the first pixel unit PX1 and the second pixel unit PX2, according to the descriptions related to the first pixel unit PX1 and the second pixel unit PX2, any person of ordinary skill in the art should be able to understand that there are electrodes 142 corresponding to each of the pixel units PX formed on protection layer 170.

In the present embodiment, during the process of forming the electrodes 142, a conductive electrode 162 may also be formed on the protection layer 170. In other words, in the present embodiment, the electrodes 142 and the conductive electrode 162 may belong to the same film layer. As illustrated in FIG. 2A, the conductive electrode 162 may be electrically connected to the first pad 160 through the contact window O7 in the protection layer 170. Since the cross-sectional view depicted in FIG. 2A merely partially illustrates partial structures of the first pixel unit PX1 and the second pixel unit PX2, according to the descriptions related to the first pixel unit PX1 and the second pixel unit PX2, any person of ordinary skill in the art should be able to understand that there is the conductive electrode 162 corresponding to each first pad 160 formed on the protection layer 170. In the present embodiment, the electrodes 142 and the conductive electrode 162 may be respectively made of a metal, an alloy, metal oxynitride, or any other applicable material, or a stack layer of at least two of the aforementioned materials, wherein the metal oxynitride includes, for example, indium tin oxide (ITO), indium zinc oxide (IZO), aluminum tin oxide (ATO), aluminum zinc oxide (AZO), indium-gallium-zinc oxide (IGZO) or a stack layer of at least two of the aforementioned materials, but the invention is not limited thereto.

Figure 2B:
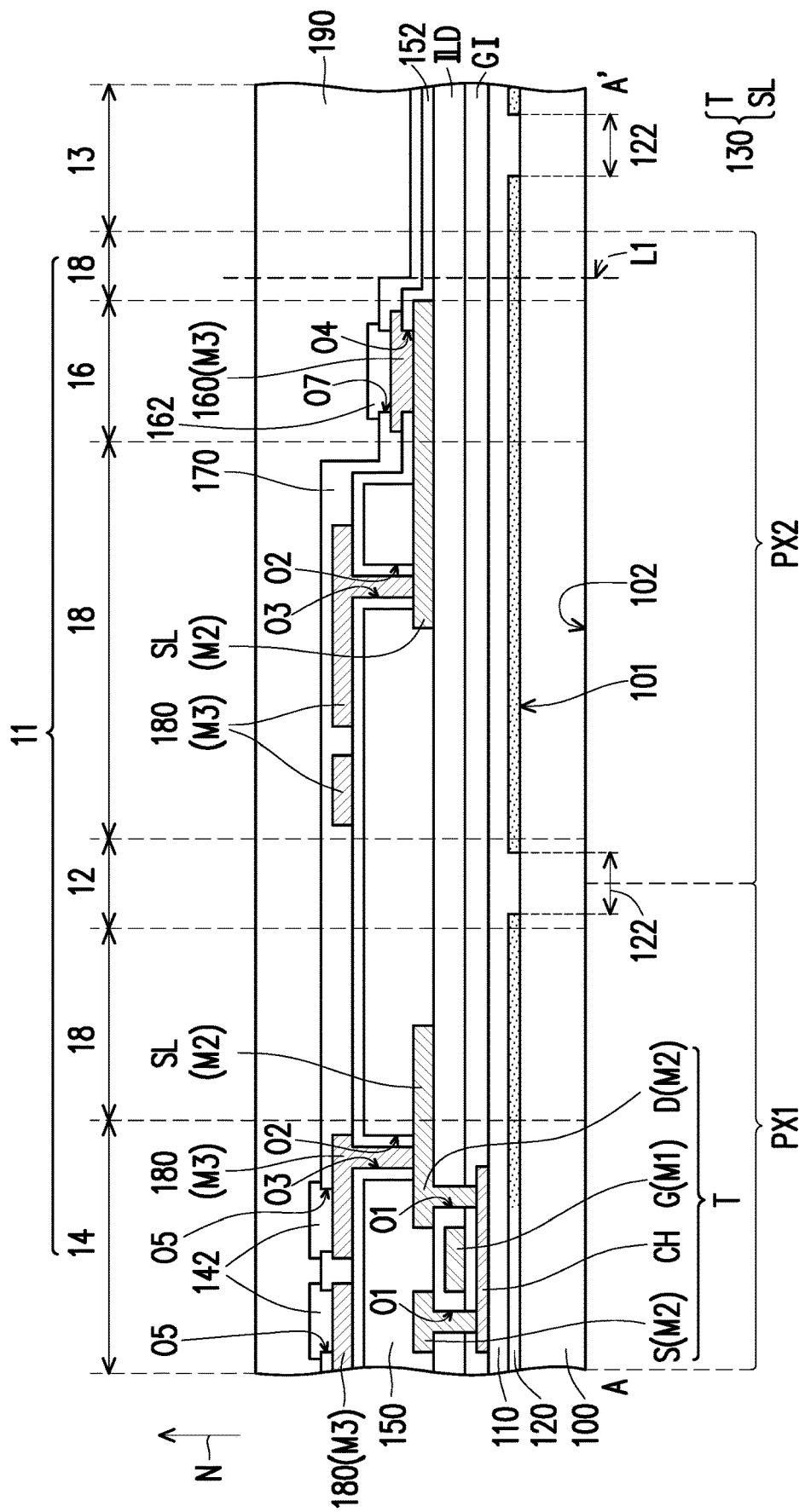
Figure 2C:
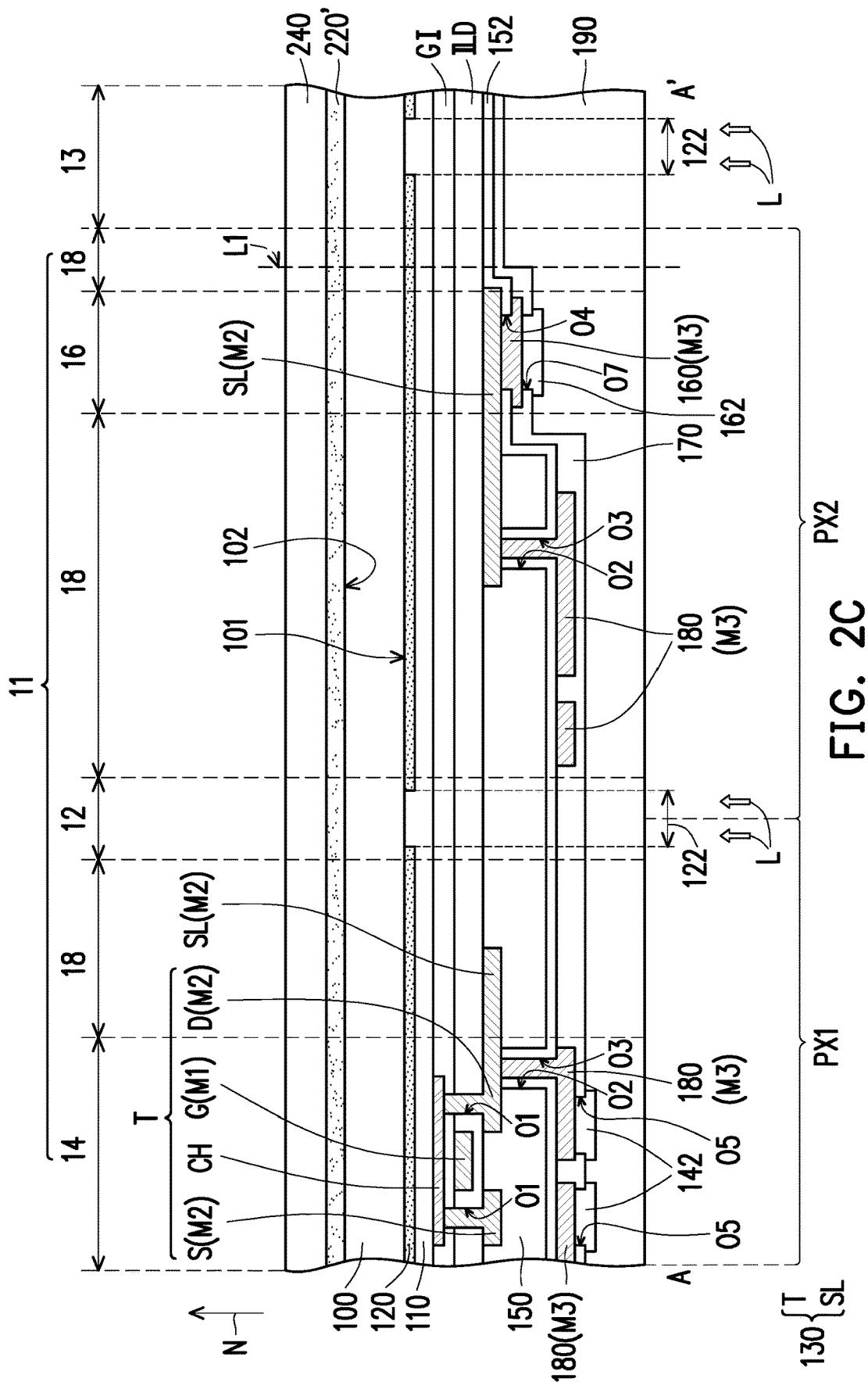

Then, referring to FIG. 2B and FIG. 2C, before the step of forming a transparent material layer 220', a protection layer 190 is formed on the first surface 101 of the substrate 100. As illustrated in FIG. 2B, the protection layer 190 covers the protection layer 170, the electrodes 142 and the conductive electrode 162 and thereby, is capable of protecting the plurality of pixel units PX from being affected during a subsequent process of turning over the substrate 100 to dispose a film layer on the second surface 102.

Then, referring to FIG. 2B and FIG. 2C, after the structure illustrated in FIG. 2B is turned upside down, the transparent material layer 220' and a photoresist layer 240 are sequentially formed on the second surface 102 of the substrate 100. In the present embodiment, the transparent material layer 220' is capable of allowing the light beam L (which will be described in detail below) used in a subsequent exposure process to penetrate through. In the present embodiment, the transparent material layer 220' is made of, for example, a transparent or a semi-transparent insulation material having a visible light transmittance of at least 40% or more. Preferably, the visible light transmittance is approximately 45% to 100%. More preferably, the visible light transmittance is approximately 80% to 100%. Therein, the transmittance does not have a unit. A material of the photoresist layer 240 includes a positive photoresist or a negative photoresist. Hereinafter, the photoresist layer 240 is a positive photoresist as an example for description.

Referring to FIG. 2C, an exposure process is performed, such that the light beam L passes through the first alignment pattern 122 of the light-shielding positioning layer 120 and penetrates through the substrate 100 and the transparent material layer 220', to irradiate the photoresist layer 240. As described above, since the portion of the light-shielding positioning layer 120 other than the first alignment pattern 122 is capable of shielding the light beam L, and the transparent material layer 220' is capable of allowing the light beam L to penetrate through, during the exposure process, the light beam L penetrates through the first alignment pattern 122 of the light-shielding positioning layer 120 and irradiates the photoresist layer 240 corresponding to the first alignment pattern 122. The light beam L is, for example, ultraviolet (UV) light or a laser, which has a specific wavelength range and is able to react with the photoresist layer 240. In some embodiments, the light beam L may also be an electron beam, but the invention is not limited thereto.

Figure 2D:
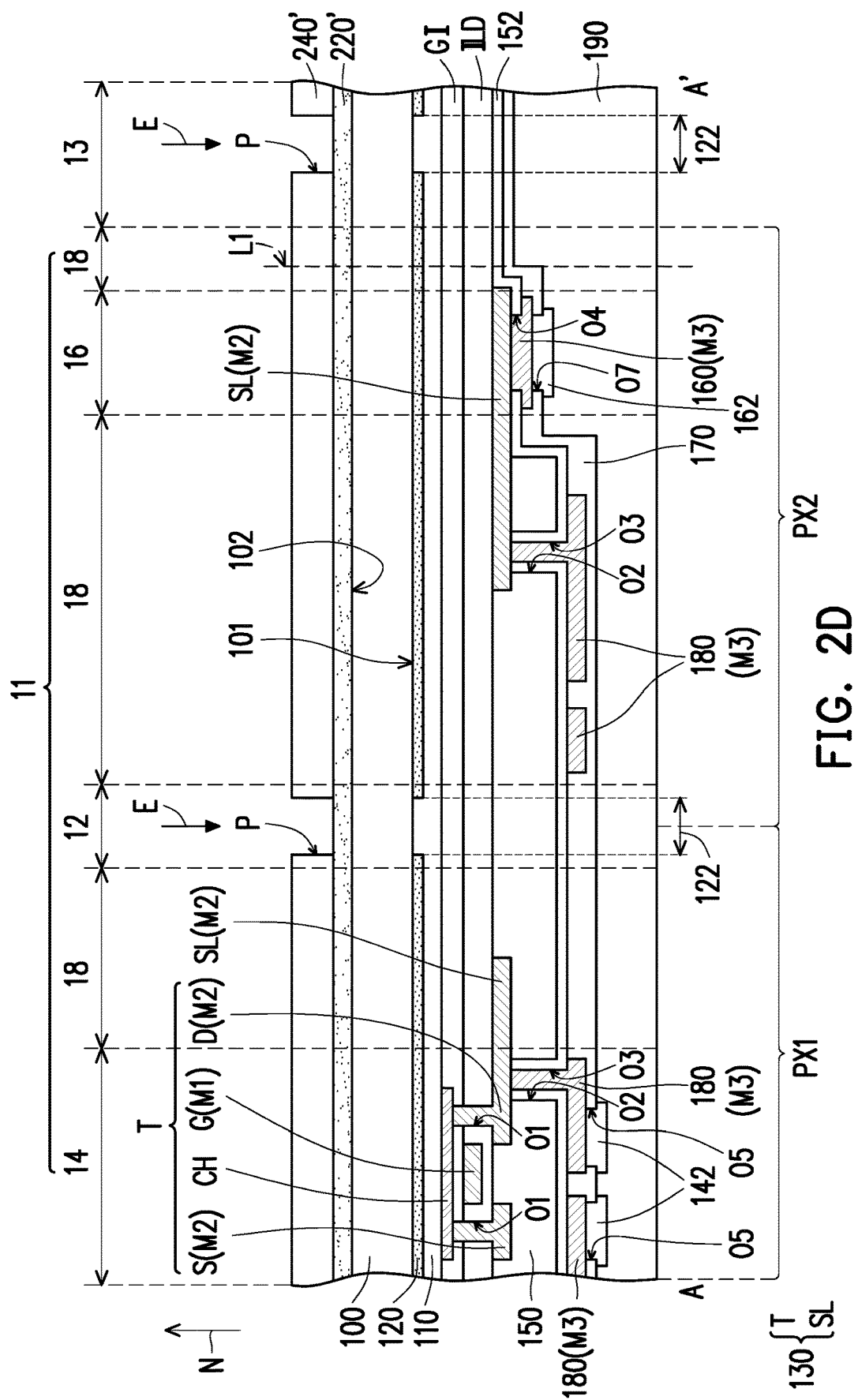

Then, referring to FIG. 2D, a developing process is performed to pattern the photoresist layer 240 to form a patterned photoresist layer 240'. In the present embodiment, since the photoresist layer 240 is the positive photoresist, an exposed portion (i.e., a portion which is irradiated by the light beam L) of the photoresist layer 240 is dissolved in a developer used in the developing process to form opening patterns P, while an unexposed portion (i.e., a portion which is not irradiated by the light beam L) forms the patterned photoresist layer 240', wherein the opening patterns P corresponds to patterns of the first alignment patterns 122. In other words, through the exposure and the developing processes, the patterns of the first alignment patterns 122 may be transferred onto the patterned photoresist layer 240'.

Figure 2E:
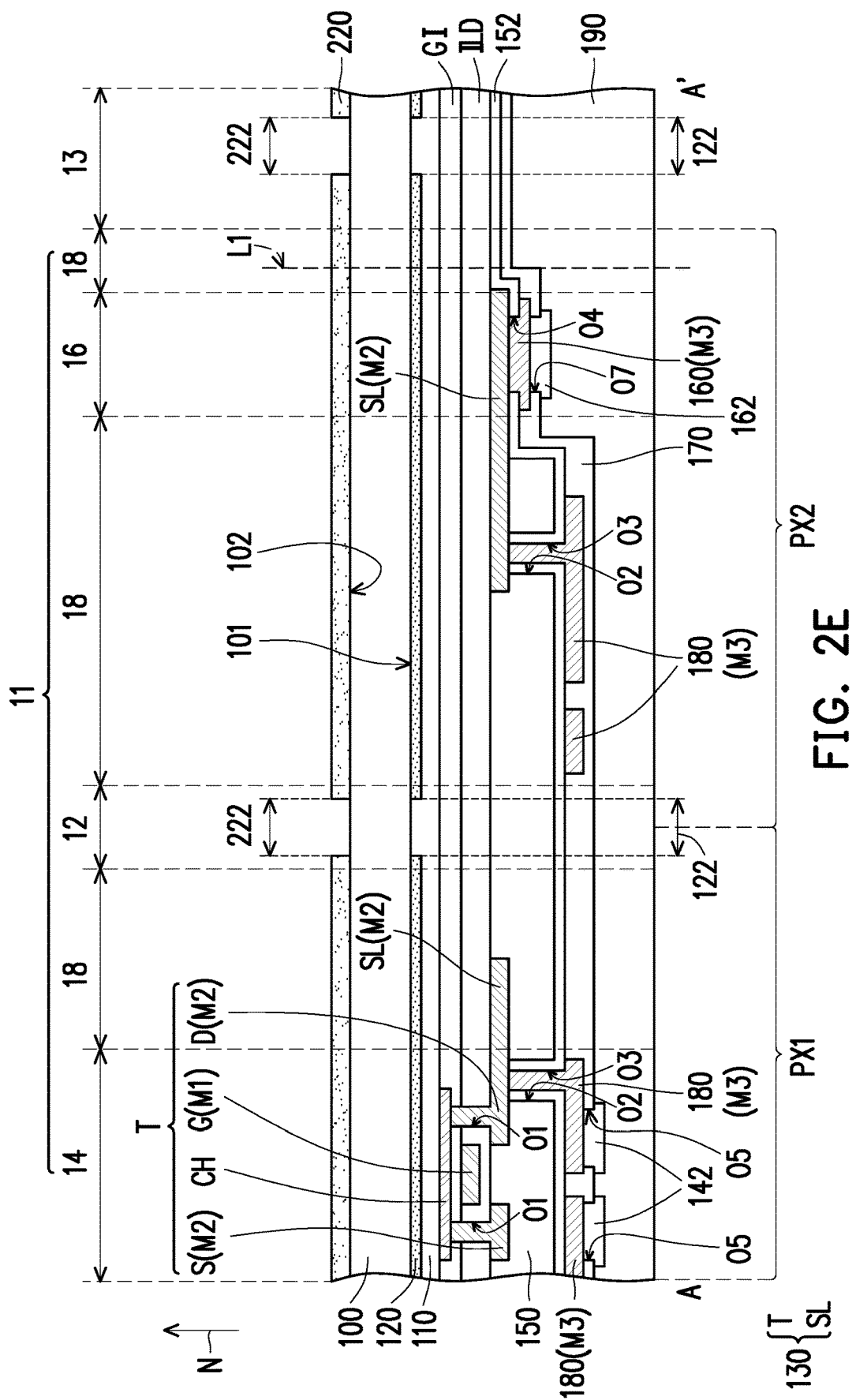

Thereafter, referring to FIG. 1B, FIG. 2D and FIG. 2E, by using the patterned photoresist layer 240' as a mask, an etching process E is performed, and the transparent material layer 220' is patterned, thereby forming the transparent positioning layer 220 having at least one second alignment pattern 222. In detail, the second alignment pattern 222 is formed by removing a portion of the transparent material layer 220' exposed from the opening patterns P. In other words, by the etching process E, patterns of the opening patterns P may be transferred onto the transparent positioning layer 220. According to another point of view, the second alignment patterns 222 of the transparent positioning layer 220 are formed by using the first alignment patterns 122 of the light-shielding positioning layer 120, and the formation of the second alignment patterns 222 may achieve an effect of self-alignment via the first alignment patterns 122 of the light-shielding positioning layer 120. In this way, in the present embodiment, in the direction N perpendicular to the substrate 100, the second alignment patterns 222 of the transparent positioning layer 220 overlap with the first alignment patterns 122 of the light-shielding positioning layer 120.

As described above, in the present embodiment, the first alignment patterns 122 are disposed corresponding to the alignment pattern area 12 and the peripheral region 13, and thus, the second alignment patterns 222 are also disposed corresponding to the alignment pattern area 12 and the peripheral region 13. However, as described above, the invention is not limited thereto, in other embodiments, the second alignment patterns 222 may be merely correspondingly disposed in the alignment pattern area 12 or may be merely correspondingly disposed in the peripheral region 13.

Additionally, based on the description related to the first alignment patterns 122, any person of ordinary skill in the art should be able to understand that the number of the second alignment patterns 222 may be designed as one or more based on actual requirements and is not limited to the number as illustrated in FIG. 1B. Additionally, based on the description related to the first alignment patterns 122, any person of ordinary skill in the art should be able to understand that a shape of the second alignment patterns 222 is not limited to the criss-cross shape. In the present embodiment, the etching process E is, for example, a dry-etching process and/or a wet-etching process.

As illustrated in FIG. 2E, in the cross-section along the cross-section line A-A', a size of each second alignment pattern 222 is approximately equal to a size of each first alignment pattern 122. However, the invention is not limited thereto, in other embodiments, according to an etching condition, an exposure condition and/or influence of a refractivity or a material of the related film layer, the size of each second alignment pattern 222 may be greater or smaller than the size of each first alignment pattern 122. In other words, in the direction N perpendicular to the substrate 100, the first alignment patterns 122 may completely overlap with the second alignment patterns 222, or the first alignment patterns 122 may be located inside outer edges of the second alignment patterns 222. Additionally, according to the description related to the first alignment patterns 122 in the peripheral region 13 set forth above, any person of ordinary skill in the art should be able to understand that a layout of the second alignment pattern 222 located in the peripheral region 13 is not limited to that as illustrated in FIG. 1B.

Referring again to FIG. 2E, after the transparent positioning layer 220 is formed, the patterned photoresist layer 240' is removed. A method of removing the patterned photoresist layer 240' may include a laser ablation process, an etching process, a developing process or any other adaptive removing method or a combination of at least two of the aforementioned processes.

In some embodiments, the photoresist layer 240 may be a negative photoresist, and in this circumstance, in the developing process, an unexposed portion (i.e., a portion which is not irradiated by the light beam L) in the photoresist layer 240 is dissolved in a developer used in the developing process, while an exposed portion (i.e., a portion which is irradiated by the light beam L) remains due to being incapable of being dissolved in the developer to form the patterned photoresist layer 240'. In other words, in the embodiment that the photoresist layer 240 is the positive photoresist (i.e., the implementation manner illustrated in FIG. 2E), the second alignment patterns 222 are opening patterns, while in the embodiment that the photoresist layer 240 is the negative photoresist, the second alignment patterns 222 are approximately solid patterns.

Figure 2F:
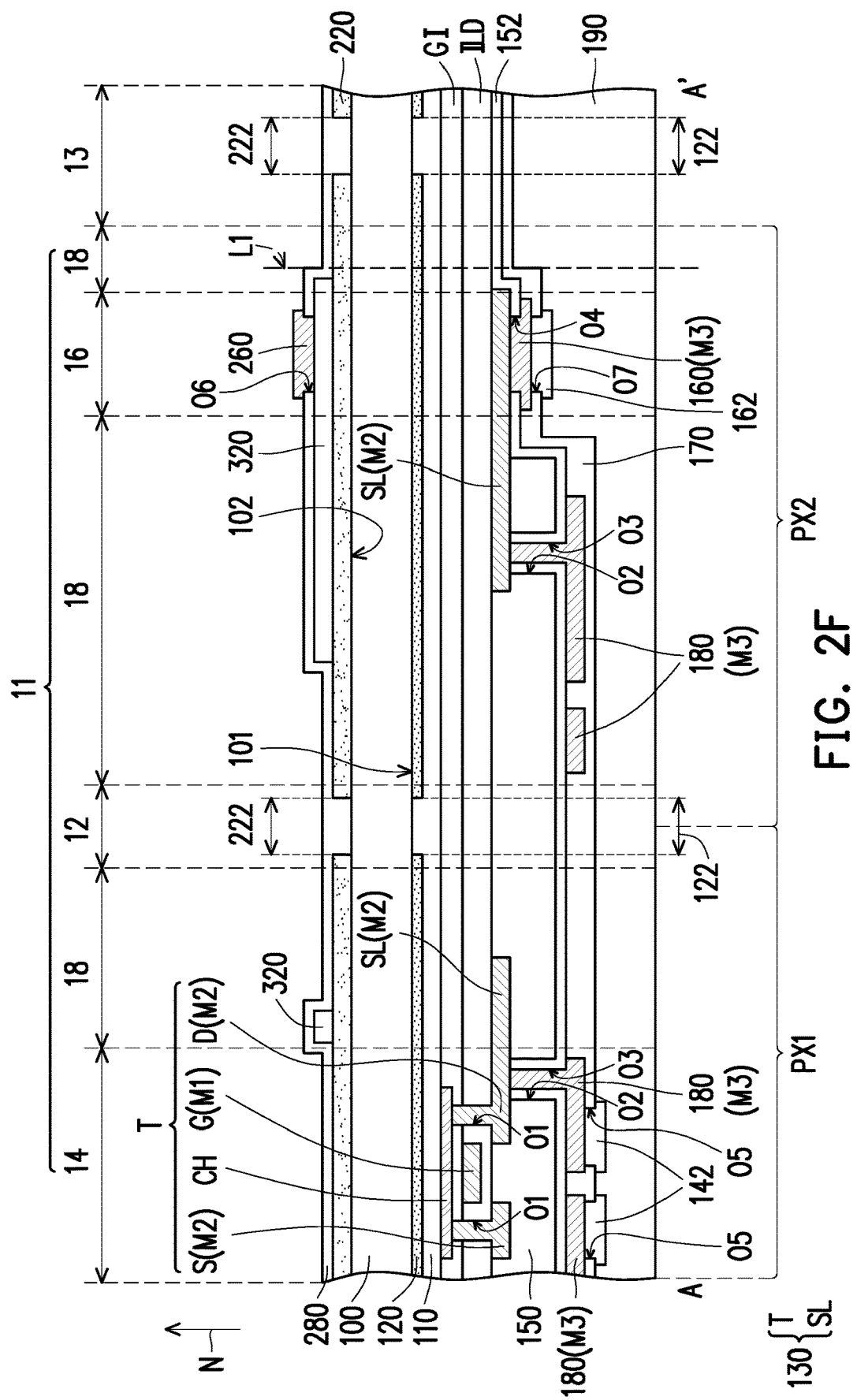

Then, referring to FIG. 1B and FIG. 2F, multiple fan-out lines 320 are formed on the transparent positioning layer 220. Based on the consideration of conductivity, the fan-out lines 320 are generally made of a metal material, but the invention is not limited thereto. According to other embodiments, the fan-out lines 320 may be made of an alloy or a metal material and/or a stack layer of an alloy and any other conductive material, which includes, for example, a metal nitride material, a metal oxide material, a metal oxynitride material or any other applicable material. In another embodiment, the light-shielding positioning layer 120 may also be made of an organic conductive material or a stack layer of the at least two materials of the aforementioned fan-out lines 320, but the invention is not limited thereto. Even though FIG. 1B illustrates 8 fan-out lines 320, the invention is not limited thereto, and any person of ordinary skill in the art should be able to understand that the number of the fan-out lines 320 may be designed as one or more based on actual requirements.

Referring again to FIG. 2F, in the present embodiment, after the fan-out lines 320 are formed, a fourth insulation layer 280 may be selectively formed on the transparent positioning layer 220. In the present embodiment, a material of the fourth insulation layer 280 includes an inorganic material, an organic material or a combination of the materials or any other applicable material. The inorganic material includes, for example (but not limited to), silicon oxide, silicon nitride, silicon oxynitride or a stack layer of at least two of the materials. The organic material includes, for example (but not limited to), a polyimide-based resin, an epoxy resin or an acrylic resin or any other polymer material. In the present embodiment, the material of the fourth insulation layer 280 may be the same as or different from the material of the first insulation layer 110. In the present embodiment, the fourth insulation layer 280 is a single film layer, but the invention is not limited thereto. In other embodiments, the fourth insulation layer 280 may be formed by stacking a plurality of film layers.

As illustrated in FIG. 2F, the fourth insulation layer 280 has the contact window O6, wherein the contact window O6 exposes a portion of one of the fan-out lines 320. Since FIG. 2F illustrates only the cross-section along the cross-section line A-A', according to the description related to the fan-out lines 320 set forth above, any person of ordinary skill in the art should be able to understand that the fourth insulation layer 280 has the contact window O6 corresponding to each of the fan-out lines 320. In the present embodiment, the fourth insulation layer 280 is correspondingly disposed in the display region 11 and the peripheral region 13. In the present embodiment, the fourth insulation layer 280 fills in the second alignment pattern 222.

Referring again to FIG. 1B and FIG. 2F, in the present embodiment, an alignment process is performed by using the second alignment pattern 222 to form at least one second pad 260 on the fourth insulation layer 280. As illustrated in FIG. 1B, the at least one second pad 260 includes 8 second pads 260 for example, but the invention is not limited thereto, and the number of the second pads 260 may be designed as one or more based on actual requirements. In the present embodiment, each second pad 260 is electrically connected to the corresponding fan-out line 320. For instance, as illustrated in FIG. 1B, any one of the second pads 260 is electrically connected to one of the fan-out lines 320 in a one-to-one relationship. On the other hand, as illustrated in FIG. 2F, the second pads 260 are electrically connected to the corresponding fan-out lines 320 through the contact windows O6 in the fourth insulation layer 280. Based on the consideration of conductivity, the second pads 260 are generally made of a metal material, but the invention is not limited thereto. In other embodiments, the second pads 260 may also be made of the material of the first pads 160, and the two may be substantially the same or different.

As described above, since the first pad 160 may be accurately formed on the first alignment patterns 122 in the pad regions 16 via the formation of the second alignment patterns 222 to achieve an effect of self-alignment, the second pads 260 formed based on the use of the second alignment patterns 222 may also be accurately formed in the pad regions 16. In other words, in the present embodiment, in the direction N perpendicular to the substrate 100, the second pads 260 overlap with the first pads 160. According to another point of view, in the present embodiment, the first alignment patterns 122 and the second alignment patterns 222 having an alignment relationship with each other are respectively used as alignment marks for forming the first pads 160 on the first surface 101 and the second pads 260 on the second surface 102. In this way, the disposition of the first alignment pattern 122 and the second alignment patterns 222 contributes to improving alignment accuracy of the first pads 160 and the second pads 260 disposed on the two opposite surfaces of the substrate 100.

It is to be additionally mentioned that in the illustration herein, the first alignment patterns 122 are used as the alignment marks for forming the first pads 160, and the second alignment patterns 222 are used as the alignment marks for forming the second pads 260, however, any person of ordinary skill in the art should be able to understand that the first alignment patterns 122 may be used as alignment marks for forming any components on the first surface 101, and the second alignment patterns 222 may be used as alignment marks for forming any components on the on the second surface 102.

Additionally, in the present embodiment, during the process of forming the second pads 260, a plurality of third pads 262 electrically connected to the fan-out lines 320 may be further formed. In other words, in the present embodiment, the second pads 260 and the third pads 262 may belong to the same film layer. For instance, as illustrated in FIG. 1B, any one of the third pads 262 is electrically connected to one of the fan-out lines 320 in a one-to-one relationship. According to another point of view, in the present embodiment, each of the fan-out lines 320 is used to electrically connect one of the second pads 260 to one of the third pads 262. Even though FIG. 1B illustrates 8 third pads 262, but the invention is not limited thereto, and any person of ordinary skill in the art should be able to understand that the number of the third pads 262 may be designed as one or more based on actual requirements.

Figure 2G:
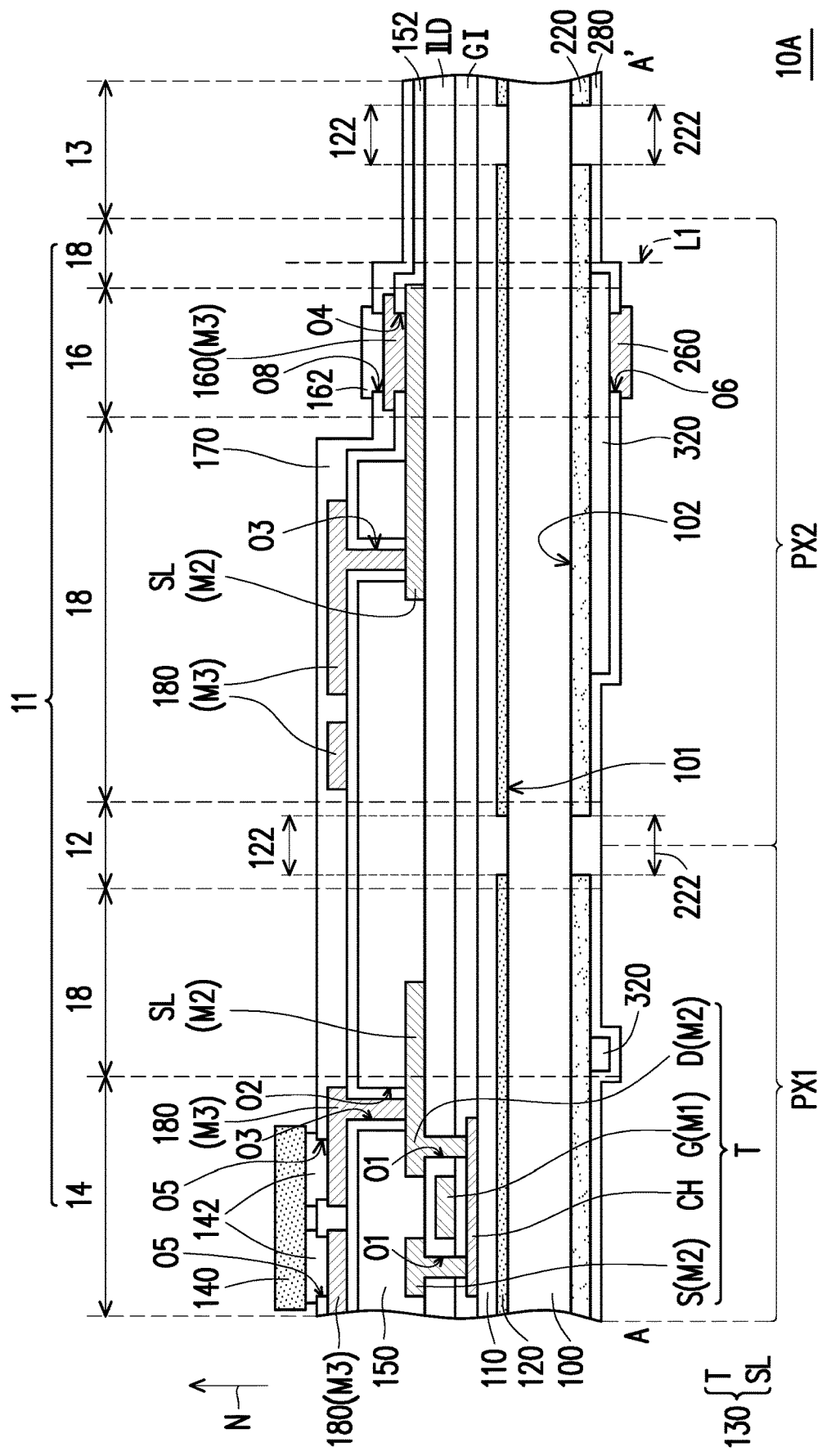

Then, referring to FIG. 2G, after the structure illustrated in FIG. 2F is turned upside down, the protection layer 190 is removed. A method of removing the protection layer 190 includes, for example, a dry-etching process, a wet-etching process, a laser ablation process, or any other applicable process or a combination of at least two of the aforementioned processes.

Referring again to FIG. 2G, after the protection layer 190 is removed, a light-emitting element 140 is formed in the element area 14. Since the cross-sectional view depicted in FIG. 2G merely partially illustrates partial structures of the first pixel unit PX1 and the second pixel unit PX2, according to the descriptions related to the first pixel unit PX1 and the second pixel unit PX2, any person of ordinary skill in the art should be able to understand that each of the pixel units PX includes at least one light-emitting element 140 disposed corresponding to the element area 14. In the present embodiment, the light-emitting element 140 is electrically connected to the element layer 130 through the electrodes 142 and the conductive lines 180. In the present embodiment, the light-emitting element 140 may be an inorganic and/or an organic light-emitting diode (LED), for example, a micro-LED, a mini-LED, a quantum dot, a perovskite LED or any other adaptive LED or a combination of at least two of the aforementioned elements. Additionally, in the present embodiment, the light-emitting element 140 belongs to a flip chip type LED, but the invention is not limited thereto. In other embodiments, the light-emitting element 140 may also be a vertical LED, a horizontal LED or any other applicable light-emitting element. So far, the display panel 10A (for example, a display mother panel) before being cut has been substantially completed. Additionally, the display panel before being cut has a predetermined cutting line L1, which facilitates cutting in a subsequent process to complete the manufacturing of the display panel 10B. As illustrated in FIG. 1A and FIG. 2G, the predetermined cutting line L1 is located within the display region 11 and at least partially surrounding the display region 11. For instance, as illustrated in FIG. 1A, element areas 14, the pad region 16 and the alignment pattern area 12 are both located within the area surrounded by the predetermined cutting line L1.

Referring to FIG. 1A, FIG. 2G and FIG. 3 simultaneously, a cutting process is performed along the predetermined cutting line L1 to cut the peripheral region 13 and a portion of the display region 11 of the substrate 100 to form the display panel 10B. In the present embodiment, the cutting process is, for example, a laser cutting process, a water jet cutting process, a knife wheel cutting process, or any other applicable process or a combination of at least two of the aforementioned processes. It is to be mentioned that since the peripheral region 13 is removed by the cutting process, the display panel 10B is a frameless display panel, which is adapted to manufacture a spliced display device. In the present embodiment, even though the predetermined cutting line L1 is located within the display region 11, but the invention is not limited thereto. In some embodiments, the predetermined cutting line L1 may be located within the peripheral region 13, and in this circumstance, the display panel 10B is a narrow-frame display panel since only a portion of the peripheral region 13 is removed in the cutting process.

In some embodiments, after the aforementioned cutting process is performed, a micro-etching process, a polishing process or any other applicable flattening process or a combination of at least two of the aforementioned processes may be further performed on a side surface 103 of the display panel 10B to improve flatness of the side surface 103.

Additionally, as illustrated in FIG. 3, after the cutting process is finished, a connection structure 400 is formed on the display panel 10B to electrically connect the first pad 160 and the second pad 260 disposed opposite to each other. In detail, the connection structure 400 is electrically connected to the first pad 160 through the conductive electrode 162. Additionally, in the present embodiment, the connection structure 400 covers the side surface 103 of the display panel 10B. Since FIG. 3 merely illustrates a partial cross-section (corresponding to cross-section line A-A') of the display panel 10B, according to the description related to the first pads 160 and the second pads 260 set forth above, any person of ordinary skill in the art should be able to understand that the display panel 10B may have the connection structure 400 corresponding to each first pad 160 and each second pad 260. In other words, in the present embodiment, the connection structure 400 is used to transmit signals between the first pads 160 disposed on the first surface 101 and the second pads 260 disposed on the second surface 102.

Additionally, any person of ordinary skill in the art should be able to understand that the display panel 10B may further include an external circuit (not shown) electrically connected to the third pads 262. The external circuit (not shown) is, for example, a driver chip, a control circuit, a flexible printed circuit (FPC), a printed circuit board (PCB) disposed with a driver chip, an FPC disposed with a driver chip or any other applicable external circuit or a combination of at least two of the aforementioned elements.

It is to be mentioned that in the manufacturing method of the display panel 10B, the second alignment patterns 222 of the transparent positioning layer 220 are formed by performing the etching process E on the transparent material layer 220' using the patterned photoresist layer 240' as the mask after the exposure process and the developing process are performed on by using the first alignment patterns 122 of the light-shielding positioning layer 120 to form the patterned photoresist layer 240', thus, the second alignment patterns 222 are formed by means of self-alignment and overlap with the first alignment patterns 122 in the direction N perpendicular to the substrate 100.

Furthermore, since the formation of the second alignment patterns 222 achieves the effect of self-alignment via the first alignment patterns 122, alignment accuracy between the first pads 160 formed based on the use of the first alignment patterns 122 and the second pads 260 formed based on the use of the second alignment patterns 222 may be improved. In this way, in the display panel 10B, a probability that the connection structure 400 fails to achieve the connection capability due to misalignment of the first pads 160 and the second pads 260 may be reduced, thereby enhancing reliability of the display panel 10B by avoiding poor electrical connection.

In the embodiment illustrated in FIG. 2G, the first alignment patterns 122 are formed in the light-shielding positioning layer 120 between the substrate 100 and the element layer 130, but the invention is not limited thereto. In other embodiments, the first alignment patterns 122 may be formed in another film layer on the first surface 101 of the substrate 100. Hereinafter, other embodiments will be described with reference to FIG. 4 and FIG. 5. It should be noted that, in the embodiment described below, element labels and portions of the previous embodiments are referenced hereafter, and the same or similar elements are indicated by the same or similar reference labels. The descriptions of the same technical details are therefore not repeated here. The parts omitted from description may be referenced from the afore-described embodiments and are not repeated in the embodiment below.

Figure 4:
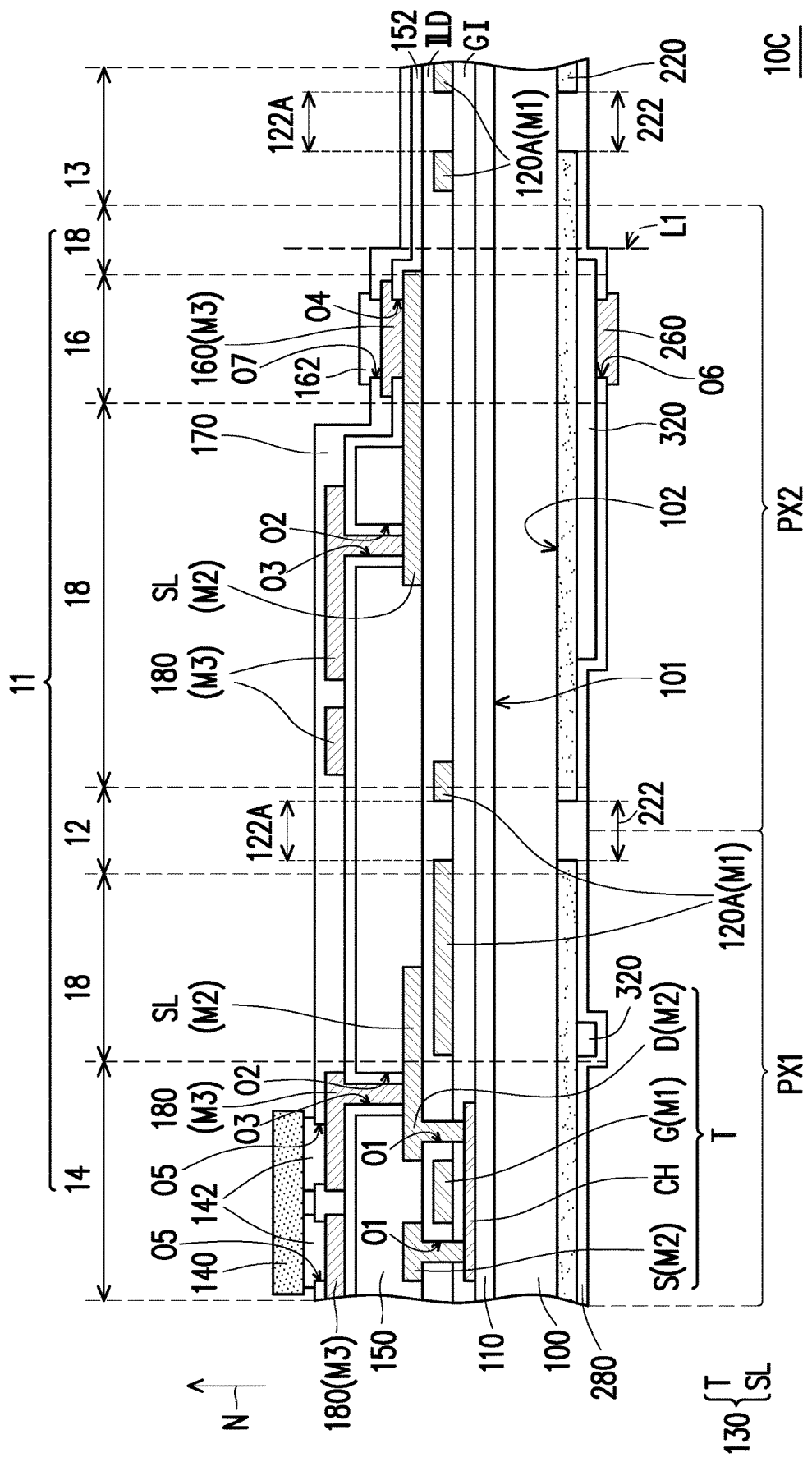
FIG. 4 is a schematic cross-sectional views showing a display panel before being cut according to another embodiment of the invention.

FIG. 4 is a schematic cross-sectional views showing a display panel before being cut according to another embodiment of the invention. Referring to FIG. 2G and FIG. 4, a display panel 10C before being cut illustrated in FIG. 4 is similar to the display panel before being cut (which is exemplified as a display mother panel) illustrated in FIG. 2G, thus, the same or similar elements are indicated by the same or similar reference labels, and the descriptions of the same technical details are omitted. The parts omitted from description may be referenced from the afore-described embodiments. Hereinafter, the difference between the display panel 10C before being cut illustrated in FIG. 4 and the display panel before being cut illustrated in FIG. 2G will be described.

Referring to FIG. 4, in the present embodiment, a light-shielding positioning layer 120A having at least one first alignment pattern 122A and the gate G of the active element T belong to the same film layer, namely, the light-shielding positioning layer 120A is formed by the first conductor layer M1. According to another point of view, in the present embodiment, the light-shielding positioning layer 120A having the at least one first alignment pattern 122A is formed after the step of forming the first insulation layer 110 and before the step of forming the second insulation layer 150. For instance, a method of forming the light-shielding positioning layer 120A having the at least one first alignment pattern 122A may include, after the light-shielding material layer (not shown) is formed on the first insulation layer 110, patterning the light-shielding material layer to form the light-shielding positioning layer 120A having the at least one first alignment pattern 122A.

In the present embodiment, since the light-shielding positioning layer 120A and the gate G may be performed through the same masking process, the manufacturing of the display panel 10C before being cut may be compliable with the currently available manufacturing processes. The other parts may be referenced from the afore-described embodiments and are not repeated hereinafter.

Figure 5:
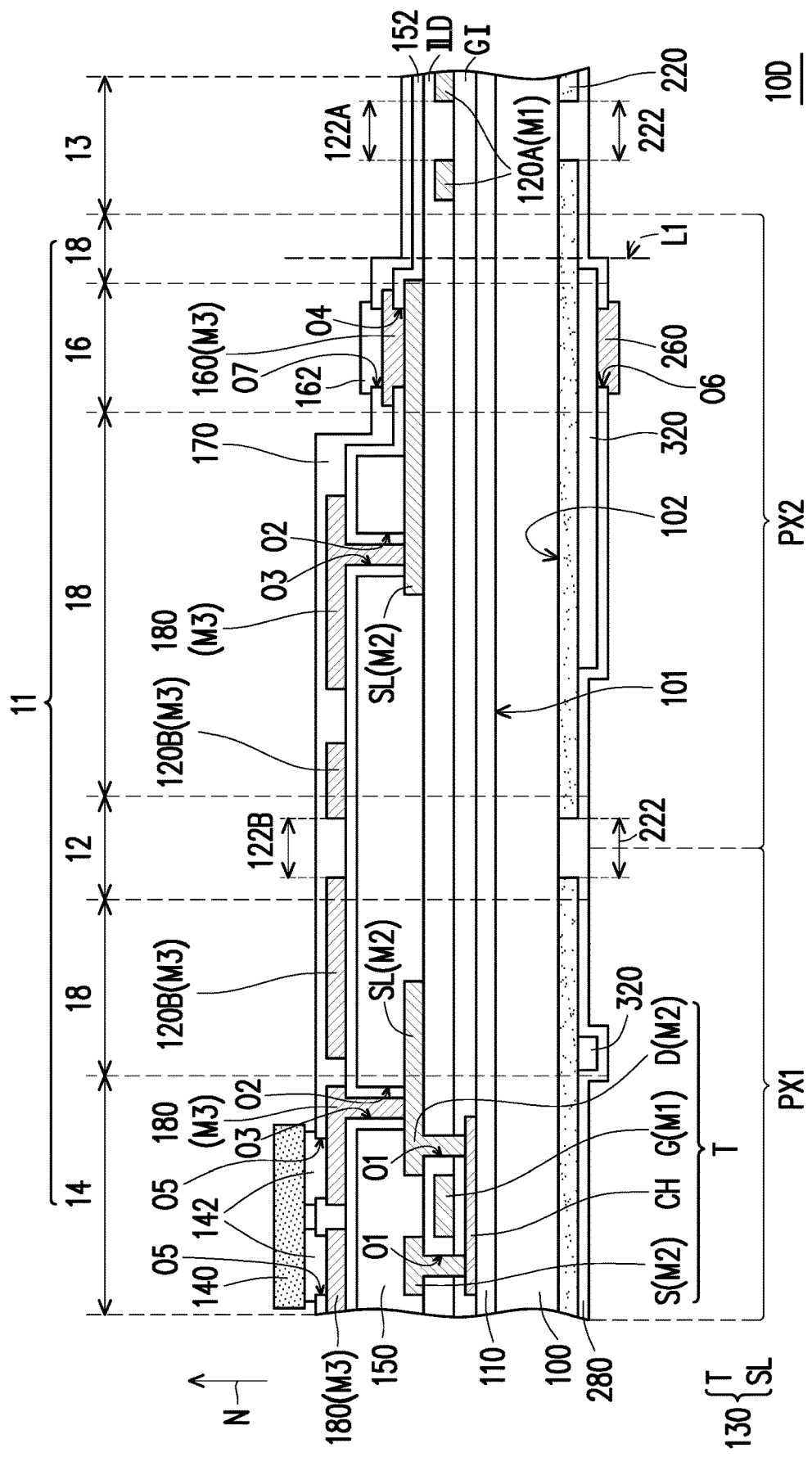
FIG. 5 is a schematic cross-sectional views showing a display panel before being cut according to yet another embodiment of the invention.

FIG. 5 is a schematic cross-sectional views showing a display panel before being cut according to another embodiment of the invention. Referring to FIG. 2G and FIG. 5, a display panel 10D before being cut illustrated in FIG. 5 is similar to the display panel 10C before being cut illustrated in FIG. 4, thus, the same or similar elements are indicated by the same or similar reference labels, and the descriptions of the same technical details are omitted. The parts omitted from description may be referenced from the afore-described embodiments. Hereinafter, the difference between the display panel 10D before being cut illustrated in FIG. 5 and the display panel 10C before being cut illustrated in FIG. 4 will be described.

Referring to FIG. 5, in the present embodiment, light-shielding positioning layers 120B having at least one first alignment pattern 122B and the conductive lines 180 belong to the same film layer, namely, the light-shielding positioning layers 120B are formed by the third conductor layers M3. According to another point of view, in the present embodiment, the light-shielding positioning layers 120B having the at least one first alignment pattern 122B are formed after the step of forming the second insulation layer 150 and before the step of forming the protection layer 170. For instance, a method of forming the light-shielding positioning layers 120B having the at least one first alignment pattern 122B may include, after the light-shielding material layer (not shown) is formed on the second insulation layer 150, patterning the light-shielding material layer to form the light-shielding positioning layers 120B having the at least one first alignment pattern 122B.

As illustrated in FIG. 5, the light-shielding positioning layers 120B are located in the display region 11, and the light-shielding positioning layer 120A is located in the peripheral region 13. In other words, in the present embodiment, the first alignment pattern 122B located in the display region 11 and the first alignment patterns 122 located in the peripheral region 13A are formed in different manufacturing processes.

In the present embodiment, since the light-shielding positioning layer 120A and the gate G may be patterned through the same masking process, and the light-shielding positioning layers 120B and the conductive lines 180 may be patterned through the same masking process, and thus, the display panel 10D before being cut may be compliable with the currently available manufacturing processes. The other parts may be referenced from the afore-described embodiments and are not repeated hereinafter.

Even though the embodiments illustrated in FIG. 4 and FIG. 5 merely disclose the formation of the light-shielding positioning layer 120A and the light-shielding positioning layers 120B by using the first conductor layers M1 and the third conductor layers M3, according to the descriptions related to the embodiments illustrated in FIG. 4 and FIG. 5, any person of ordinary skill in the art should be able to understand that the light-shielding positioning layers of the invention may also be formed by the second conductor layers M2.

In light of the foregoing, in the manufacturing method of the display panel of one of the embodiments of the invention, the second alignment patterns of the transparent positioning layer are formed by the following steps. The substrate having the first surface and the second surface opposite to the first surface is provided. The exposure process and the developing process are performed using the first alignment patterns of the light-shielding positioning layers located on the first surface to form the patterned photoresist layer located on the second surface. And, the etching process is performed on the transparent material layer located on the second surface using the patterned photoresist layer as the mask. Thereby, the second alignment patterns can be formed by means of self-alignment and overlap with the first alignment patterns in the direction perpendicular to the substrate.

On the other hand, since the second alignment patterns can be formed by means of self-alignment via the first alignment patterns, the alignment accuracy between the first pads formed by performing the alignment process using the first alignment patterns and the second pads formed by performing the alignment process using the second alignment patterns can be improved. In this way, in the display panel of the invention, through disposing the light-shielding positioning layer having the first alignment patterns on the first surface and disposing the transparent positioning layer having the second alignment patterns on the second surface, the first alignment patterns can overlap with the second alignment patterns in the direction perpendicular to the substrate, such that the probability that the connection structure fails to achieve the connection capability due to misalignment of the first pads disposed on the first surface and the second pads disposed on the second surface can be reduced, and the reliability can be enhanced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a display panel, comprising:
    providing a substrate having a first surface and a second surface opposite to the first surface;
    forming a light-shielding positioning layer on the first surface, wherein the light-shielding positioning layer has at least one first alignment pattern;
    forming a transparent material layer on the second surface;
    forming a photoresist layer on the transparent material layer;
    performing an exposure process, such that a light beam passes through the at least one first alignment pattern to penetrate through the substrate and the transparent material layer to the photoresist layer;
    performing a developing process to pattern the photoresist layer and form a patterned photoresist layer; and
    performing an etching process to pattern the transparent material layer using the patterned photoresist layer as a mask to form a transparent positioning layer having at least one second alignment pattern,
    wherein in a direction perpendicular to the substrate, the at least one first alignment pattern overlaps with the at least one second alignment pattern.

2. The manufacturing method of the display panel according to claim 1, wherein before the step of forming the transparent material layer, further comprising:
    forming a first insulation layer on the first surface; and
    forming a plurality of pixel units on the first insulation layer, and the step of forming each of the pixel units comprising:
        forming an element layer on the first insulation layer;
        forming a second insulation layer on the element layer; and
        forming a plurality of conductive lines on the second insulation layer, the conductive lines being electrically connected to the element layer,
    wherein the substrate has a display region and a peripheral region surrounding the display region, the display region comprises a plurality of element areas, a conductive line area and at least one alignment pattern area, the element areas and the at least one alignment pattern area are separated from each other, and the conductive line area surrounds the element areas and the at least one alignment pattern area,
    wherein the pixel units are located in the display region,
    wherein the at least one first alignment pattern is disposed corresponding to the at least one alignment pattern area or the peripheral region.

3. The manufacturing method of the display panel according to claim 2, wherein the at least one first alignment pattern is plural, and the first alignment patterns are disposed corresponding to the at least one alignment pattern area and the peripheral region.

4. The manufacturing method of the display panel according to claim 2, wherein before the step of forming the first insulation layer, comprising:
    forming a light-shielding material layer on the first surface; and
    patterning the light-shielding material layer to form the light-shielding positioning layer having at least one first alignment pattern.

5. The manufacturing method of the display panel according to claim 2, wherein after the step of forming the first insulation layer, comprising:
    forming a light-shielding material layer on the first insulation layer; and
    patterning the light-shielding material layer to form the light-shielding positioning layer.

6. The manufacturing method of the display panel according to claim 2, wherein after the step of forming the second insulation layer, comprising:
    forming a light-shielding material layer on the second insulation layer; and
    patterning the light-shielding material layer to form the light-shielding positioning layer.

7. The manufacturing method of the display panel according to claim 2, further comprising:
    forming at least one first pad on the element layer, the at least one first pad being electrically connected to the element layer; and
    forming a protection layer on the conductive lines and the at least one first pad,
    wherein the display region of the substrate further comprises at least one pad region, the at least one pad region and the at least one alignment pattern area are separated from each other, and the at least one first pad is disposed corresponding to the at least one pad region.

8. The manufacturing method of the display panel according to claim 7, wherein after the step of forming the transparent positioning layer, further comprising:
    performing an alignment process through the at least one second alignment pattern and forming at least one second pad on the transparent positioning layer,
    wherein the at least one second pad is disposed corresponding to the at least one pad region, and in the direction perpendicular to the substrate, the at least one second pad overlaps with the at least one first pad.

9. The manufacturing method of the display panel according to claim 8, wherein after the step of forming at least one second pad, further comprising:
    performing a cutting process along a predetermined cutting line; and
    forming at least one connection structure, the at least one connection structure electrically connecting the at least one first pad to the at least one second pad,
    wherein in the direction perpendicular to the substrate, the predetermined cutting line is located within the display region, and the element areas, the at least one pad region and the at least one alignment pattern area are located within a region surrounding the predetermined cutting line.

10. The manufacturing method of the display panel according to claim 9, further comprising:
   before the step of forming the transparent material layer, forming a protection layer on the first surface, and the protection layer covering the pixel units and the substrate; and
   before the step of forming the at least one connection structure, removing the protection layer.

11. The manufacturing method of the display panel according to claim 2, wherein the step of forming each of the pixel units, further comprising:
   disposing a light-emitting element on the conductive lines, the light-emitting element corresponding to one of the element areas, and the light-emitting element being electrically connected to the element layer.

12. The manufacturing method of the display panel according to claim 1, wherein a material of the photoresist layer comprises a positive photoresist or a negative photoresist.

* * * * *